(12) United States Patent
Ni

(10) Patent No.: US 10,068,942 B2
(45) Date of Patent: Sep. 4, 2018

(54) PHOTODIODE ARRAY HAVING A CHARGE-ABSORBING DOPED REGION

(71) Applicant: NEW IMAGING TECHNOLOGIES, Verriers le Buisson (FR)

(72) Inventor: Yang Ni, Palaiseau (FR)

(73) Assignee: NEW IMAGING TECHNOLOGIES, Verrieres le Buisson (FR)

( * ) Notice: Subject to any disclaimer, the term of this patent is extended or adjusted under 35 U.S.C. 154(b) by 113 days.

(21) Appl. No.: 14/764,713

(22) PCT Filed: Jan. 31, 2014

(86) PCT No.: PCT/EP2014/051866
§ 371 (c)(1),
(2) Date: Jul. 30, 2015

(87) PCT Pub. No.: WO2014/118308
PCT Pub. Date: Aug. 7, 2014

(65) Prior Publication Data
US 2015/0372047 A1   Dec. 24, 2015

(30) Foreign Application Priority Data
Jan. 31, 2013 (FR) ..................... 13 50830

(51) Int. Cl.
*H01L 27/146* (2006.01)
*H01L 31/0304* (2006.01)
(Continued)

(52) U.S. Cl.
CPC .... *H01L 27/14649* (2013.01); *H01L 27/1461* (2013.01); *H01L 27/14694* (2013.01);
(Continued)

(58) Field of Classification Search
CPC ......... H01L 27/1461; H01L 27/14649; H01L 31/109; H01L 31/1844; H01L 31/03046; H01L 27/14694
(Continued)

(56) References Cited

U.S. PATENT DOCUMENTS

| 9,018,727 B2 * | 4/2015 | Ni ....................... H01L 31/1035 257/448 |
| 2009/0001412 A1 * | 1/2009 | Nagai ............... H01L 27/14643 257/184 |
| 2009/0045395 A1 * | 2/2009 | Kim .................. H01L 27/14649 257/18 |

FOREIGN PATENT DOCUMENTS

| EP | 0373752 | 6/1990 |
| EP | 1354360 | 10/2003 |

(Continued)

OTHER PUBLICATIONS

French Search Report, dated Jul. 5, 2013, French Application No. 1350830.
(Continued)

*Primary Examiner* — Bo Fan
(74) *Attorney, Agent, or Firm* — Womble Bond Dickinson (US) LLP

(57) ABSTRACT

The invention concerns a photodiode array, and the method for producing same, comprising—a cathode comprising at least one substrate layer (4) made from a material from the indium phosphide family and one active layer (5) made from a material from the gallium indium arsenide family, and characterized in that the array further comprises at least two sorts of doped regions of the same type at least partially formed in the active layer (5):—first doped regions (3) forming, with the cathode, photodiodes for forming
(Continued)

images,—at least one second doped region (8) absorbing excess charge carriers so as to discharge them.

11 Claims, 5 Drawing Sheets

(51) Int. Cl.
*H01L 31/109* (2006.01)
*H01L 31/18* (2006.01)

(52) U.S. Cl.
CPC ...... *H01L 31/03046* (2013.01); *H01L 31/109* (2013.01); *H01L 31/1844* (2013.01)

(58) Field of Classification Search
USPC .................. 257/443, 448, 184, 18; 438/73
See application file for complete search history.

(56) References Cited

FOREIGN PATENT DOCUMENTS

FR          1156290        5/1958
WO     WO-2013007753    1/2013

OTHER PUBLICATIONS

International Search Report, dated Mar. 4, 2014, Application No. PCT/EP2014/051866.

\* cited by examiner

PHOTODIODE ARRAY HAVING A CHARGE-ABSORBING DOPED REGION

FIELD OF THE INVENTION

The invention concerns photodiode arrays, and more particularly photodiode arrays containing layers in indium-gallium arsenide (InGaAs) and indium phosphide (InP), and the method for manufacturing the same.

BACKGROUND OF THE INVENTION

One of the methods for manufacturing a photodiode array in semiconductor materials with narrow band gap (often for detection in infrared light)—is to insert the active detection layer with narrow band gap between two semiconductor materials having a wide band gap. The two layers of wide band gap semiconductors provide efficient protection/passivation whilst remaining transparent to the radiation wavelength intended to be detected by the photodiodes.

In addition, with suitable doping, the two heterojunctions between the active layer and the two protection/passivation layers confine the photoelectric charges within the active detection layer and improve the quantum yield of the photodiode thus constructed.

An InGaAs photodiode is a typical example of this physical structure. The active detection layer formed of InGaAs material can have an adjustable band gap as a function of the indium and gallium composition of the InGaAs material, ideal for operation in the SWIR band (Short Wave InfraRed) in the order of 1.4 to 3 μm.

Indium phosphide and indium-gallium arsenide share the same face-centred cubic crystalline structure. The composition most frequently used is $In_{0.53}Ga_{0.47}As$. The size of the crystalline lattice is then comparable with that of the InP substrate, in particular the lattice parameters. This crystalline compatibility allows epitaxial growth of an active InGaAs layer of excellent quality on an InP substrate. The band gap of $In_{0.53}Ga_{0.47}As$ is about 0.73 eV, capable of detecting up to a wavelength of 1.68 μm in the SWIR band. It is of increasing interest in fields of application such as spectrometry, night vision, the sorting of waste plastics, etc.

The two protection/passivation layers are generally formed of InP. More especially since the $In_{0.53}Ga_{0.47}As$ composition has the same size of crystalline lattice as InP this allows for a very low dark current on and after ambient temperature.

FIG. 1 illustrates the physical structure of a photodiode array 1. An active layer composed of InGaAs is sandwiched between two InP layers. The bottom layer in fact forms the substrate 4 on which the InGaAs layer is formed by complex MO-CVD epitaxy. This InGaAs layer is then protected by a thin passivation layer 6 composed of InP, also deposited by epitaxy. In general, the InP layers are of N-type and silicon-doped. The active InGaAs layer 5 can be slightly N-doped or it can remain quasi-intrinsic. Therefore the two bottom/top InP layers and the active layer 5 of InGaAs form the common cathode of the photodiodes in this array.

The individual anodes 3 are formed by local diffusion of zinc (Zn). The dopant Zn passes through the thin InP passivation layer 6 and enters into the active InGaAs layer 5.

FIG. 2 illustrates an InGaAs image sensor formed of an array 1 of InGaAs photodiodes connected in flip-chip mode to a read-out circuit 2. In an InGaAs sensor array the array of photodiodes is connected to a read-out circuit generally formed of silicon to read the photoelectric signals generated by these InGaAs photodiodes. This interconnection is generally obtained using the flip-chip technique via indium beads 8 as illustrated in FIG. 2. SWIR radiation 9 arrives at the array of photodiodes through the substrate 4 of indium phosphide that is transparent in this optical band.

With a detector operating in integration mode, an output signal is obtained proportional to the product of flow and exposure time. However, the output signal is limited by the maximum integration capacity of the detector. For scenes having high contrast, it is often impossible to obtain good rendering of dark areas and at the same time to maintain the bright areas saturation-free. This is all the more problematic for night vision for which a sensor array with InGaAs photodiodes is often intended.

Another general manner for reading the photoelectric signals of photodiodes is put forward in document EP1354360 and for which the principle is illustrated in FIG. 3 of the appended drawings. Document EP1354360 proposes the solar cell functioning of a photodiode 51 to obtain a logarithmic response as a function of the intensity of incident optical radiation 59.

With this functioning mode, the photodiode 51 does not receive any external biasing and is forward biased by the photoelectric charges generated at its junction. The forward bias voltage observed on the photodiode is proportional to the logarithm of incident optical flow.

This logarithmic response allows the coverage, without any electrical and optical adjustment, of a dynamic operating range greater than 120 dB, indispensable for use of an InGaAs SWIR sensor under natural outside conditions. Document EP1354360 also proposes associating a switched read-out circuit 55 with the photodiode.

The principle of use of the image sensor array illustrated in FIG. 3 is the following:

a) the selection signal SEL is activated to select the desired photodiode 51 by closing switch 54. Once this photodiode is selected, the first read-out signal RD1 is activated which will close the corresponding controlled switch for the purpose of memorising the voltages of a first read-out in the memory 56. This first read-out records both the image and the fixed pattern noise;

b) The reset signal RSI is then activated which will cause closing of switch 53. The photodiode being thus short-circuited, a reference image is thereby simulated in absolute darkness;

c) The first read-out signal RD1 is then deactivated to re-open the corresponding switch and the second read-out signal RD2 is activated to record in the memory element 57 the voltages of the second read-out. In this manner the fixed pattern noise alone has been memorised;

d) the difference is calculated between the result of the two memorisations contained in the memory elements 56 and 57 respectively by a differential amplifier 58. The output signal of this amplifier 58 then corresponds to an image free of fixed pattern noise.

By means of the second read-out, a zero voltage corresponding to the darkness condition is generated. This electronic darkness signal allows the deletion of signal offsets in the read-out chain of a detector array.

The principle proposed by EP1354360 was applied in an InGaAs sensor and operates perfectly. However a blooming phenomenon was observed in daytime scenes. This phenomenon can simply be described as loss of spatial resolution in an image. The detector nevertheless remains sensitive to variations in light following the logarithmic law.

French patent application N° 1156290 proposes electric insulation by etching around each photodiode. With this approach it is possible to obtain efficient suppression of this blooming phenomenon but at the cost of a very strong dark current in the photodiodes due to defects created by this etching. Another problem with this approach is the fact that the steps of etching and photodiode anode diffusion are two separate steps in the manufacturing process requiring different masks. Mask alignment errors can create additional non-uniformities between the photodiodes of an array.

PRESENTATION OF THE INVENTION

The present invention proposes another solution that is both simple and efficient to overcome this blooming phenomenon in an InGaAs photodiode array. The solution proposes by the present invention also allows an improvement in the image quality of a conventional detector in integration mode.

For this purpose, there is proposed a photodiode array comprising:
a cathode comprising at least one substrate layer in material from the indium phosphide family and an active layer in material from the indium-gallium arsenide family; and
at least two sorts of doped regions of same type formed at least in part in the active layer:
first doped regions which, together with the cathode, form photodiodes for the forming of images;
at least one second doped region absorbing excess charge carriers for the evacuation thereof.

The photodiode array of the invention is advantageously completed by the following characteristics taken alone or in any technically possible combination:
biasing means maintain said second doped region at an electric potential equal to or lower than the lowest potential of the first doped regions;
the potential of the second doped region is modulated as a function of the illumination level on the photodiode array;
the first doped regions and the second doped region have one same doping level at one same depth;
the second doped region is located between at least some of the first doped regions;
the second doped region surrounds some first doped regions individually;
the second doped region forms a grid pattern between some first doped regions;
a plurality of second doped regions are distributed parallel to one another and intercalated with some first doped regions;
the second doped region is separated from the first doped regions by a sufficient distance so that the space-charge regions associated with the second doped region and first doped regions respectively are separated;
a metal gate on the surface of said array links different points of the second doped region or regions to homogenize the electric potential of the second doped region(s).

The invention also concerns an image sensor incorporating a photodiode array according to the first aspect. Preferably the read-out circuit is a logarithmic circuit.

There is also proposed a method for manufacturing a photodiode array, said array comprising:

a cathode comprising at least one substrate layer in material from the indium phosphide family and an active layer in material from the indium-gallium arsenide family;
at least two sorts of doped regions of same type formed at least in part in the active layer:
first doped regions which, together with the cathode, form photodiodes for the forming of images;
at least one second doped region absorbing charge carriers emitted by the photodiodes;
the method being characterized in that the first doped regions and said at least one second doped region are formed at one same selective doping step.

BRIEF DESCRIPTION OF THE FIGURES

Other aspects, objectives and advantages of the present invention will become better apparent on reading the following detailed description. The invention will also be better understood with reference to this description considered in conjunction with the appended drawings given as non-limiting examples and in which.

DETAILED DESCRIPTION

Figure 1:
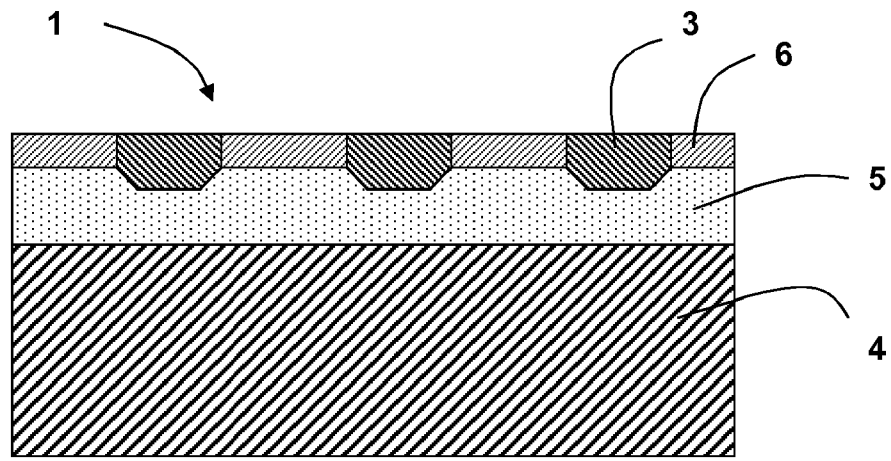
FIG. 1, already commented upon, is a schematic illustrating the structure of an InGaAs photodiode array of the state of the art.
Figure 2:
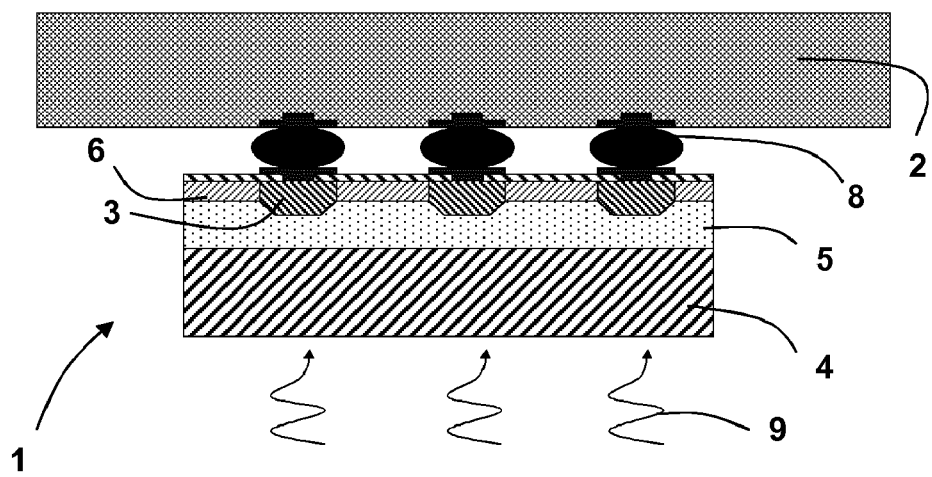
FIG. 2, already commented upon, illustrates an InGaAs image sensor formed of an InGaAs photodiode array connected via flip-chip to a read-out circuit on silicon substrate.
Figure 4:
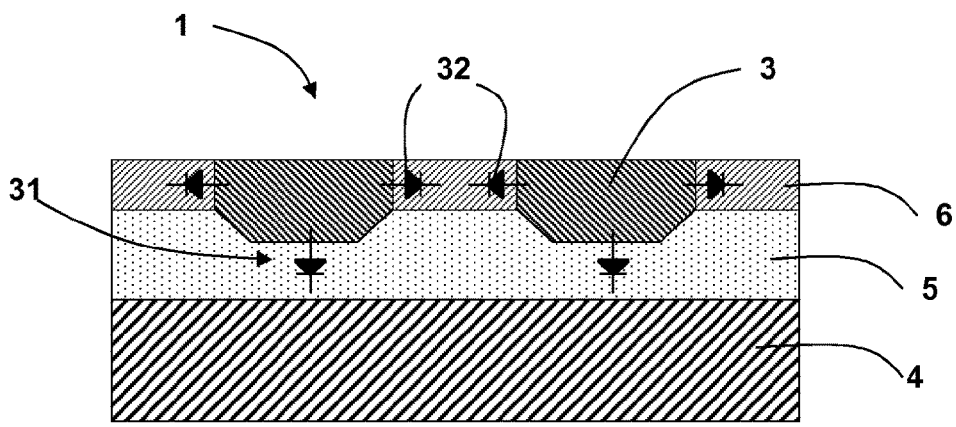
FIG. 4 illustrates the different junctions in a prior art photodiode array.

In a prior art structure as illustrated in FIG. 1, it can be ascertained that each photodiode contains several PN junctions one of which is desired and a certain number of which are parasitic. These PN junctions are illustrated in FIG. 4. The PN junctions 31 between the anodes 3 and the active layer 5 are desired and form the diodes of the photodiode array.

The parasitic lateral PN junctions 32, between the anodes 3 and the passivation layer 6, form a possible electrical pathway between neighbouring photodiodes via the passivation layer.

A conventional read-out circuit, in a capacitor, integrates the reverse current in the photodiode by applying a reverse bias thereto. In this configuration, the parasitic lateral junctions 32 in the photodiodes are reverse biased at the same time, having the effect of adding an additional parasitic current in the integration capacitor. This parasitic current degrades image quality but generates practically no crosstalk between neighbouring photodiodes. These parasitic currents can be partly offset by complex processing of the raw image output from the read-out circuit.

When a photodiode operates in solar cell mode, the junction is forward biased by incident light. In this case, the parasitic lateral junctions 32 are also forward biased and form a pathway for electric current between neighbouring photodiodes. This forward biasing becomes greater the more the incident optical intensity increases, thereby creating a blooming effect which considerably degrades the spatial resolution of the sensor.

The present invention proposes a structure with which it is possible to reduce lateral conductivity in an InGaAs photodiode array. A photodiode array manufactured according to the present invention can be operated in solar cell mode as described in document EP1354360 without any loss of spatial resolution even in the presence of very strong optical intensities. Such an array also provides improved image quality using a conventional read-out circuit in integration mode, such as the different readout circuits CMOS ISC9705 and ISC9809 for example marketed by Indigo/FLIR in the USA. The ISC9705 circuit integrates the photoelectrical current of a photodiode directly on a capacitor (direct injection mode) and the ISC9809 circuit integrates the photoelectrical current via an operational amplifier (CTIA mode). CTIA mode allows a higher gain in charge-voltage conversion which enhances detection sensitivity.

With reference to FIGS. 5 to 9 a photodiode array comprises a cathode comprising at least one substrate layer 4 in material from the indium phosphide family and an active layer 5 in material from the indium-gallium arsenide family.

A passivation layer 6 e.g. in material from the indium phosphide family is provided above the active layer 5 of indium-gallium arsenide.

By material from the indium phosphide family is meant a semiconductor material chiefly composed, even solely composed, of indium phosphide and optionally of other components in much lesser amount e.g. dopants. This material will therefore be designated by its main component i.e. indium phosphide or InP.

Similarly, by material from the indium-gallium arsenide family is meant a semiconductor material chiefly composed, even solely composed, of indium-gallium arsenide and optionally of other components in much lesser amount e.g. dopants. This material will therefore be designated by its main component i.e. indium-gallium arsenide or InGaAs.

The photodiode array further comprises at least two sorts of doped regions of same type formed at least in part in the active layer 5:
first doped regions 3 which, together with the cathode, form photodiodes for the forming of images;
at least one second doped region 8 absorbing excess charge carriers for evacuation thereof.

A plurality of second doped regions 8 can be provided to absorb excess charge carriers for evacuation thereof from the photodiode array.

The two sorts of doped regions are therefore of the same type i.e. N or P. For reasons of simplicity the case shall be presented here wherein the two sorts of doped regions are P-type. Preferably the first doped regions 3 and the second doped region 8 have the same level of doping at the same depth.

The InP layers are therefore N-type, e.g. silicon doped. The active layer 5 in InGaAs can be slightly N-doped or it can remain quasi-intrinsic. Therefore the two lower/upper InP layers and the active InGaAs layer 5 form the common cathode of the photodiodes in this array.

The first doped regions 3 form a plurality of anodes formed at least in part in the active layer 5, the cooperation between an anode and the cathode forming a photodiode.

Figure 3:
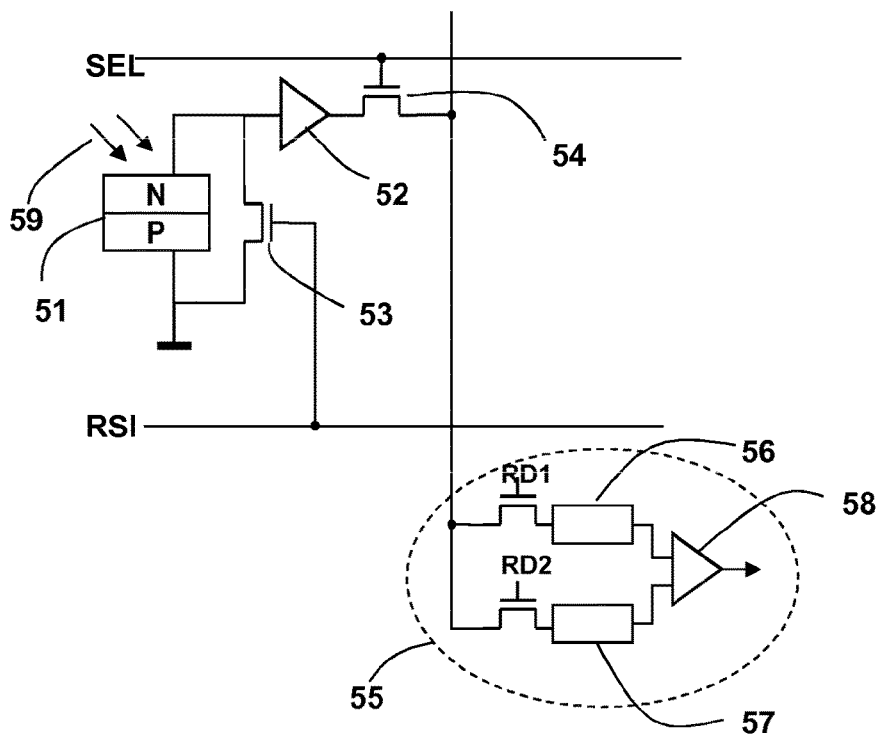
FIG. 3, already commented upon, is a flow diagram of the manufacture of a logarithmic sensor with photodiodes in solar cell mode.

The photodiodes are connected to read-out circuits similar to the one illustrated in FIG. 3 and the electric potentials Vpd1, Vpd2 they display, as a function in particular of the exposure to which they are subjected and of their biasing before exposure, are read by these read-out circuits to determine an image.

Biasing means maintain the second doped region 8 at an electric potential Vring equal to or lower than the lowest potential Vpd1, Vpd2 of the first doped regions 3 so that Vring≤min(Vpd1, Vpd2). Preferably the electric potential of the second doped region 8 is chosen to be lower than the lowest potential Vpd1, Vpd2 of the first doped regions 3 so that Vring<min(Vpd1, Vpd2).

Typically these means are in the form of an electrical connection connecting the second doped region 8 to a power source via which the electric potential Vring is imposed and via which the excess charges are evacuated that are absorbed by the second doped region 8.

Preferably, the potential of the second doped region 8 is modulated as a function of the level of illumination on the photodiode array. For this purpose, provision may be made to measure the illumination on the photodiode array in particular by means of the read-out circuit such as illustrated in FIG. 3. This illumination measurement allows determination of the potential which must be applied to the second doped region 8.

Provision can also be made to reduce the resistivity of the second doped region by adding a metal gate covering said second doped region 8 so that the application of potential and charge drainage can be uniform. This metal gate can also be used to connect together several second doped regions 8, thereby acting as connecting means for application of the potential Vring.

Figure 5:
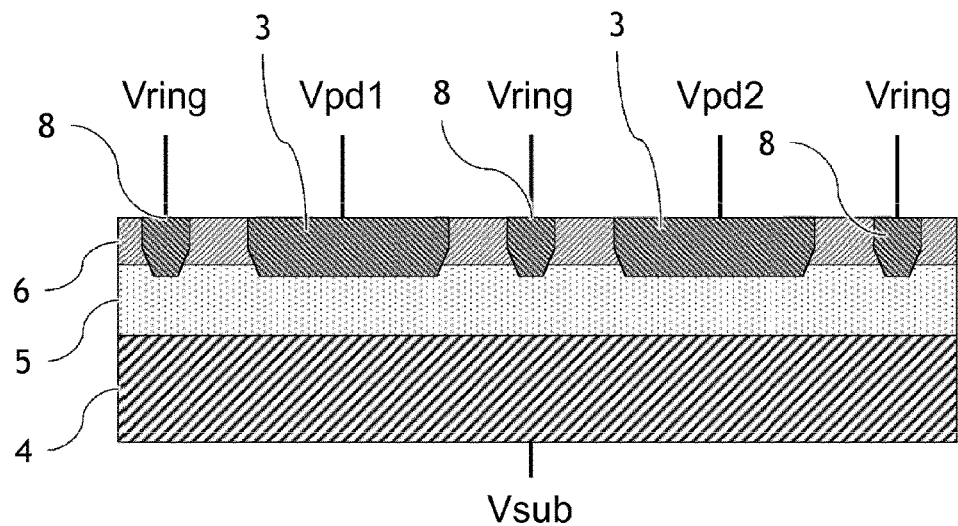
FIG. 5 is a cross-sectional view of a photodiode array according to the invention wherein different junctions are illustrated.

The second doped region 8 is located between at least some of the first doped regions 3 so as to separate the latter. FIG. 5 gives a cross-sectional view of the alternation between the first doped regions 3 and one or more second doped regions 8. Therefore in the direction of the cross-section, the second doped region(s) 8 separate the first doped regions 3 forming the anodes of the photodiodes so as to absorb the excess charges which may transit via the active layer 5 from one first doped region 3 to another.

Figure 6:
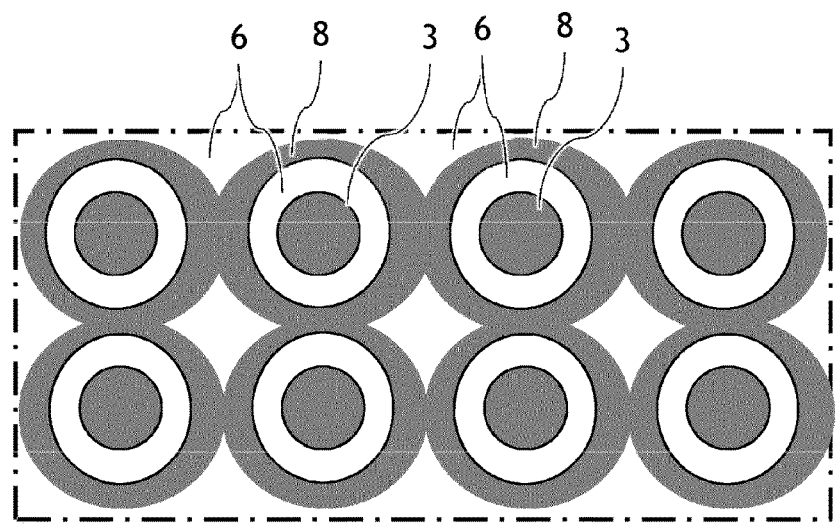
FIGS. 6 to 8 are overhead views of different embodiments of the invention.

FIG. 6 is an overhead view of one embodiment in which some first doped regions 3 are each surrounded at least in part by a doped region 8 of same type as said first doped regions 3, here N-type, that is formed at least in part in the active layer 5 to separate each of the anodes formed by said first doped regions 3 from the other anodes of said array.

Figure 7:
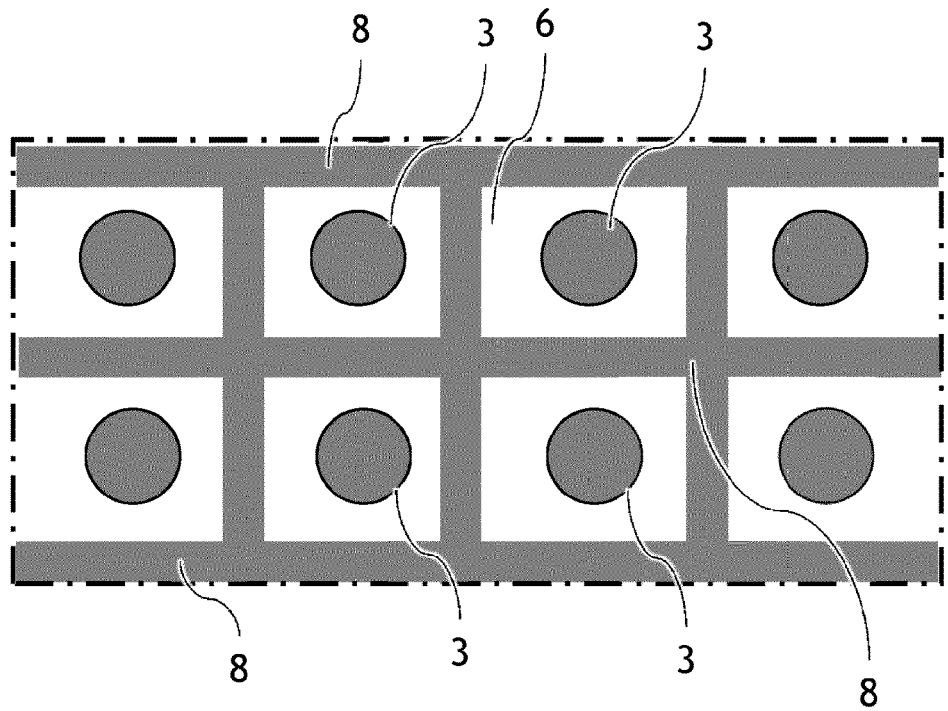

FIG. 7 is an overhead view of one embodiment in which the second doped region 8 forms a grid pattern between some first doped regions 3 so as to surround first doped regions 3 individually.

Figure 8:
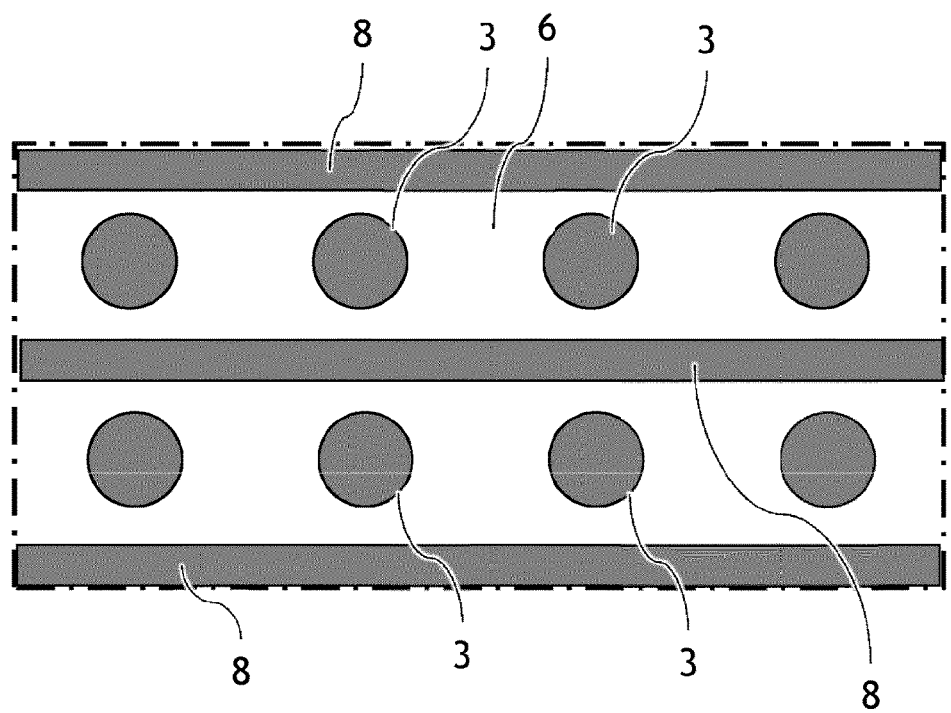
Figure 9:
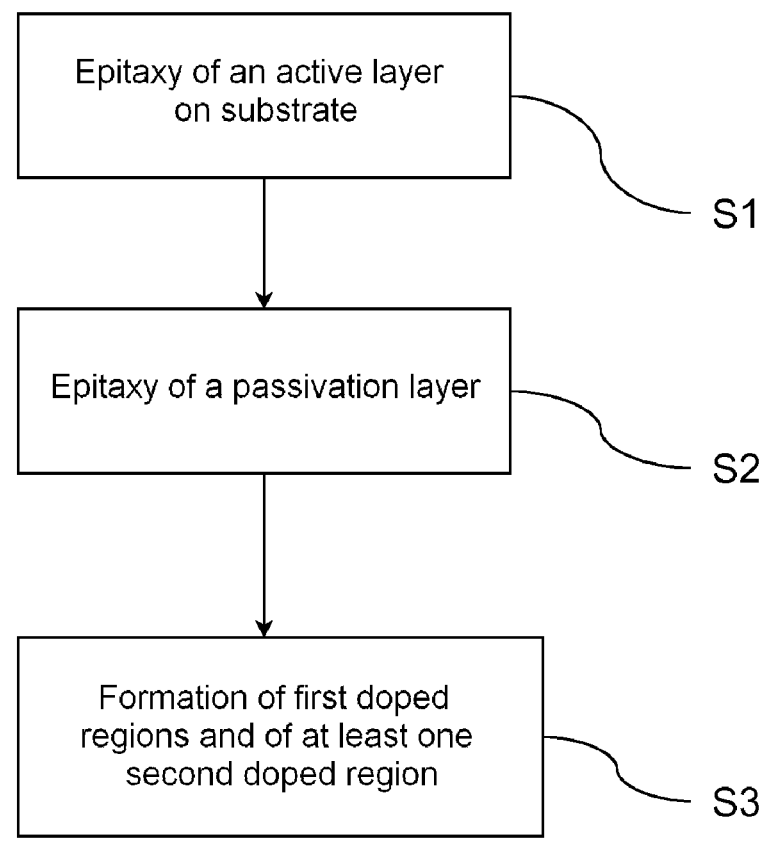
FIG. 9 is a flow diagram illustrating steps of the method according to the invention.

Preferably, to reduce the complexity of manufacture and of the interconnections, a single doped region 8 is distributed on the surface of the photodiode array. However it can be chosen to arrange a plurality of second doped regions 8 as illustrated in FIG. 8 wherein a plurality of second doped regions 8 are distributed parallel to one another and intercalated with first doped regions 3.

In the examples illustrated in FIGS. 6 and 7 all the anodes 3 are surrounded by one or more second doped regions 8. However it is not strictly necessary, although preferable and coherent, for all the photodiodes to be surrounded. Nonetheless, to obtain a significant reduction in cross-talk between photodiodes, preferably the majority of photodiodes are surrounded by at least one second doped region 8.

Similarly, in the examples illustrated in FIGS. 5 and 6, the first regions 3 are fully surrounded by second doped regions 8. However, a doped region 8 around a first doped region 3 may have openings and will therefore only partly surround a first doped region 3.

Some first doped regions 3 not being fully surrounded by at least one second doped region 8 can be dictated by manufacturing considerations but also with a view to optimising the operation of the photodiode array. The second doped regions 8 compete with the photodiodes with respect to the charge carriers. To limit this competition, provision can be made so that the second doped region(s) 8 do not fully surround the anodes but nevertheless surround the anodes sufficiently to obtain a significant decrease in cross-talk between photodiodes.

The second doped region 8 is separated from the first doped regions 3 by a sufficient distance so that the space-charge regions, associated with the second doped region 8 and with the first doped regions 3 respectively, are separated. Therefore preferably the second doped region 8 lies away from the anode that it surrounds by a distance of at least 0.5 µm.

Preferably a second doped region 8 has a width (as seen from overhead) of at least 0.5 µm so that the photodiodes are sufficiently insulated from one another. The width (as seen from above) of a doped region 8 may therefore extend up to 2 µm for example, and even reach 5 µm.

According to a second aspect, the invention also concerns a method for manufacturing a photodiode array according to the first aspect. With reference to FIG. 7, such an array can be obtained by:

epitaxial growth (step S1) of an active layer 5 in material from the indium-gallium arsenide family (InGaAs) on a substrate 4 in material from the indium phosphide family; then epitaxial growth (step S2) of a passivation layer 6 in material from the indium phosphide family (InP) on the active layer 5; then simultaneous forming during one same selective doping step (step S3) of two sorts of doped regions of same type formed at least in part in the active layer 5: first doped regions 3 which, together with the cathode, form photodiodes for the forming of images, and at least one second doped region 8 to absorb charge carriers emitted by the photodiodes.

For example, the first doped regions 3 and said at least one second doped region 8 can be formed by selective diffusion of zinc as P-type dopant in the passivation layer 6 and in the active layer 5 when said layers are N-type.

The simultaneous forming of the first doped regions 3 and of at least one second doped region 8 allows the use of one same mask for diffusion of the dopants. As a result, the manufacturing method remains simpler and there is no risk of poor alignment of any separate implanting masks. The first doped regions 3 and the second doped region(s) therefore have similar characteristics whether regarding dopant concentration or dopant depth, the controlling of their operation thereby being facilitated via the potential applied.

The invention claimed is:

1. A photodiode array comprising:
    a cathode comprising at least one substrate layer in material from the indium phosphide family and an active layer in material from the indium-gallium arsenide family; and
    first doped regions which, together with the cathode, form photodiodes for the forming of images;
    at least one second doped region configured to absorb excess charge carriers emitted by one of the photodiodes and to evacuate thereof from the photodiode array such that said excess charge carriers do not reach another of the photodiodes, wherein the at least one second doped region does not form, together with the cathode, a photodiode for the forming of images;
    wherein the first doped regions and the at least one second region are of same type and are formed at least in part in the active layer,
    wherein biasing means maintaining said second doped region at an electric potential equal to or lower than a lowest potential of the first doped regions.

2. The array according to claim 1, wherein the potential of the second doped region is modulated as a function of the extent of illumination on the photodiode array.

3. The array according to claim 1, wherein the first doped regions and the second doped region have one same doping level at one same depth.

4. The array according to claim 1, wherein the second doped region is located between at least some of the first doped regions.

5. The array according to claim 1, wherein the second doped region surrounds first doped regions individually.

6. The array according to claim 1, wherein the second doped region forms a grid pattern between first doped regions.

7. The array according to claim 1, wherein, a plurality of second doped regions are distributed parallel to one another and intercalated with first doped regions.

8. The array according to claim 1, wherein the second doped region is separated from the first doped regions by a sufficient distance so that the space-charge regions, associated with the second doped region and first doped regions respectively, are separated.

9. The array according to claim 1, wherein a metal gate on the surface of said array connects different points of the second doped region(s) to homogenize the electric potential of the second doped region(s).

10. An image sensor incorporating a photodiode array according to claim 1.

11. A method for manufacturing a photodiode array, said array comprising:
    a cathode comprising at least one substrate layer in material from the indium phosphide family and an active layer in material from the indium-gallium arsenide family;
    first doped regions which, together with the cathode, form photodiodes for the forming of images,
    at least one second doped region absorbing charge carriers emitted by the photodiodes emitted by one of the photodiodes and evacuating thereof from the photodiode array such that said excess charge carriers do not reach another of the photodiodes, wherein the at least one second doped region does not form, together with the cathode, a photodiode for the forming of images,
wherein the first doped regions and the at least one second region are of same type and are formed at least in part in the active layer,
    wherein the first doped regions and said at least one second doped region are formed during one same selective doping step,
    wherein biasing means maintain said second doped region at an electric potential equal to or lower than a lowest potential of the first doped regions.

* * * * *